United States Patent
Weiner et al.

(10) Patent No.: US 9,225,338 B2
(45) Date of Patent: Dec. 29, 2015

(54) SYSTEM AND METHOD FOR REMOVING FAR FIELD LIMITATIONS IN MICROWAVE PHOTONIC ARBITRARY WAVEFORM GENERATORS

(71) Applicant: Purdue Research Foundation, West Lafayette, IN (US)

(72) Inventors: Andrew Marc Weiner, West Lafayette, IN (US); Amir Dezfooliyan, Berkeley, CA (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 0 days.

(21) Appl. No.: 14/215,960

(22) Filed: Mar. 17, 2014

(65) Prior Publication Data

US 2014/0376926 A1    Dec. 25, 2014

Related U.S. Application Data

(60) Provisional application No. 61/793,139, filed on Mar. 15, 2013.

(51) Int. Cl.
| | |
|---|---|
| *H04B 10/12* | (2006.01) |
| *H03K 23/00* | (2006.01) |
| *H03K 3/84* | (2006.01) |
| *H04B 10/50* | (2013.01) |

(52) U.S. Cl.
CPC ............... *H03K 23/004* (2013.01); *H03K 3/84* (2013.01); *H04B 10/505* (2013.01); *H04B 2210/006* (2013.01)

(58) Field of Classification Search
None
See application file for complete search history.

(56) References Cited

U.S. PATENT DOCUMENTS

| | | | | |
|---|---|---|---|---|
| 4,655,547 A | * | 4/1987 | Heritage | B23K 26/06 359/559 |
| 4,928,316 A | * | 5/1990 | Heritage | H01S 3/0057 398/199 |
| 6,671,298 B1 | * | 12/2003 | Delfyett | H04B 10/506 372/26 |
| 6,724,783 B2 | * | 4/2004 | Jalali | H04B 10/503 372/25 |
| 7,126,740 B2 | * | 10/2006 | Szczepanek | G02B 6/262 359/290 |
| 2007/0019281 A1 | * | 1/2007 | Mirell et al. | 359/325 |
| 2007/0019282 A1 | * | 1/2007 | Weiner | G02F 2/002 359/326 |

(Continued)

OTHER PUBLICATIONS

M. Z. Win and R. A. Scholtz, "Ultra-wide bandwidth time-hopping spread-spectrum impulse radio for wireless multiple-access communications," IEEE Transactions on Communications, 2000, 48, 679-689.

(Continued)

*Primary Examiner* — Ken Vanderpuye
*Assistant Examiner* — Jai Lee
(74) *Attorney, Agent, or Firm* — Purdue Research Foundation (57) ABSTRACT

A photonic waveform generator and a method of generating an electrical waveform based on a photonic signal are disclosed. The generator includes an input port for receiving an optical signal, a pulse shaper coupled to the input port and configured to Fourier transform the optical signal and apply a pre-distort waveform onto optical spectrum of the optical signal, a dispersive pulse stretcher coupled to the pulse shaper, an optical-to-electrical converter coupled to the dispersive pulse stretcher, and an output port coupled to the optical-to-electrical converter, the pre-distortion removes distortion of the electrical signal that exists in the absence of the pre-distortion caused by violation of far field limitation between the optical signal and the electrical signal.

12 Claims, 6 Drawing Sheets

(56) References Cited

U.S. PATENT DOCUMENTS

2008/0089698 A1* 4/2008 Jiang ............... H04B 10/505 398/189
2009/0297155 A1* 12/2009 Weiner ............... H04B 10/00 398/115

OTHER PUBLICATIONS

G. Lerosey, J. De Rosny, A. Tourin, and M. Fink, "Focusing beyond the diffraction limit with far field time reversal," Science, 2007, vol. 315, pp. 1120-1122.
C. Wang and J. Yao "Photonic Generation of Chirped Millimeter-Wave Pulses Based on Nonlinear Frequency-to-Time Mapping in a Nonlinearly Chirped Fiber Bragg Grating," IEEE Transactions on Microwave Theory and Techniques , 2008, vol. 56, pp. 542-553.
J. Chou, Y. Han, and B. Jalali, "Adaptive RF-photonic arbitrary waveform generator," IEEE Photonics Technology Letters, 2003, vol. 15, pp. 581-583.
I. S. Lin, J. D. McKinney, and A. M. Weiner, "Photonic synthesis of broadband microwave arbitrary waveforms applicable to ultra-wideband communication," IEEE Microwave and Wireless Components Letters, 2005, vol. 15, pp. 226-228.
M. H. Khan, H. Shen, Y. Xuan, L. Zhao, S. Xiao, D. E. Leaird, et al., "Ultrabroad-bandwidth arbitrary radiofrequency waveform generation with a silicon photonic chip-based spectral shaper," Nat Photon, 2010, vol. 4, pp. 117-122.
J. Capmany and D. Novak, "Microwave photonics combines two worlds," Nature Photonics, 2007, vol. 1, pp. 319-330.
J. D. McKinney, D. S. Seo, D. E. Leaird, and A. M. Weiner, "Photonically assisted generation of arbitrary millimeter-wave and microwave electromagnetic waveforms via direct space-to-time optical pulse shaping," Journal of Lightwave Technology, 2003, vol. 21, pp. 3020-3028.
V. Torres-Company, J. Lancis, and P. Andres, "Arbitrary waveform generator based on allincoherent pulse shaping," IEEE Photonics Technology Letters, 2006, vol. 18, pp. 2626-2628.
J. Yao "Photonics for ultrawideband communications," Microwave Magazine, IEEE, 2009, vol. 10, pp. 82-95.
A. M. Weiner, "Femtosecond pulse shaping using spatial light modulators," Review of Scientific Instruments, 2000, vol. 71, pp. 1929-1960.
J. Azana and M. A. Muriel, "Real-time optical spectrum analysis based on the time-space duality in chirped fiber gratings," IEEE Journal of Quantum Electronics, 2000, vol. 36, pp. 517-526.
V. Torres-Company, D. E. Leaird, and A. M. Weiner, "Dispersion requirements in coherent frequency-to-time mapping," Opt. Express, 2011, vol. 19, pp. 24718-24729.
W. Chao and J. Yao, "Chirped Microwave Pulse Generation Based on Optical Spectral Shaping and Wavelength-to-Time Mapping Using a Sagnac Loop Mirror Incorporating a Chirped Fiber Bragg Grating," Journal of Lightwave Technology, 2009, vol. 27, pp. 3336-3341.
J. T. Willits, A. M. Weiner, and S. T. Cundiff, "Line-by-line pulse shaping with spectral resolution below 890 MHz," Optics Express, 2012, vol. 20, pp. 3110-3117.
A. Dezfooliyan and A. M. Weiner, "Evaluation of Time Domain Propagation Measurements of UWB Systems Using Spread Spectrum Channel Sounding," IEEE Trans. on Ant. & Prop., 2012, vol. 60, 4855-4865.
B. H. Kolner, "Space-time duality and the theory of temporal imaging," Quantum Electronics, IEEE Journal of, 1994, vol. 30, pp. 1951-1963.
W. Q. Malik, "Spatial correlation in ultrawideband channels," IEEE Transactions on Wireless Communications , 2008, vol. 7, pp. 604-610.
Z. Chenming, G. Nan, and R. Caiming Qiu, "Time-Reversed Ultrawideband (UWB) Multiple Input Multiple Output (MIMO) Based on Measured Spatial Channels," IEEE Transactions on Vehicular Technology , 2009, vol. 58, pp. 2884-2898.
P. Blomgren, P. Kyritsi, A. D. Kim, and G. Papanicolaou, "Spatial Focusing and Intersymbol Interference in Multiple-Input Single-Output Time Reversal Communication Systems," IEEE Journal of Oceanic Engineering , 2008, vol. 33, pp. 341-355.
I. H. Naqvi, P. Besnier, and G. E. Zein, "Robustness of a time-reversal ultra-wideband system in non-stationary channel environments," Microwaves, Antennas & Propagation, IET, 2011, vol. 5, pp. 468-475.
J. D. McKinney and A. M. Weiner, "Compensation of the effects of antenna dispersion on UWB waveforms via optical pulse-shaping techniques," IEEE Transactions on Microwave Theory and Techniques , 2006, vol. 54, pp. 1681-1686.
J. D. McKinney, D. Peroulis, and A. M. Weiner, "Dispersion Limitations of Ultra-Wideband Wireless Links and Their Compensation Via Photonically Enabled Arbitrary Waveform Generation," IEEE Transactions on Microwave Theory and Techniques , 2008, vol. 56, pp. 710-719.
S. Popoff, G. Lerosey, M. Fink, A. C. Boccara, and S. Gigan, "Image transmission through an opaque material," Nat Commun, 2010, 1:81.
O. Katz, E. Small, Y. Bromberg, and Y. Silberberg, "Focusing and compression of ultrashort pulses through scattering media," Nature Photonics, 2011, vol. 5, pp. 372-377.
D. J. McCabe, A. Tajalli, D. R. Austin, P. Bondareff, I. A. Walmsley, S. Gigan, et al., "Spatiotemporal focusing of an ultrafast pulse through a multiply scattering medium," Nat Commun, 2011, 2:447.
A. Dezfooliyan, et al., Evaluation of Time Domain Propagation Measurements of UWB Systems Using Spread Spectrum Channel Sounding, IEEE Transactions on Antennas and Propagation, 2012, vol. 60, No. 10, 4855-4865.

* cited by examiner

SYSTEM AND METHOD FOR REMOVING FAR FIELD LIMITATIONS IN MICROWAVE PHOTONIC ARBITRARY WAVEFORM GENERATORS

CROSS-REFERENCE TO RELATED APPLICATIONS

The present U.S. patent application is related to and claims the priority benefit of U.S. Provisional Patent Application Ser. No. 61/793,139 filed Mar. 15, 2013, the contents of which are hereby incorporated by reference in its entirety into the present disclosure.

STATEMENT REGARDING GOVERNMENT FUNDING

This invention was made with government support under N00244-09-1-0068 awarded by the Naval Postgraduate School. The government has certain rights in the invention.

TECHNICAL FIELD

The present disclosure generally relates to systems and method for frequency to time mapping of broadband optical signals and in particular to systems and methods for generating high fidelity arbitrary waveforms with radically increased time-bandwidth product.

BACKGROUND

This section introduces aspects that may help facilitate a better understanding of the disclosure. Accordingly, these statements are to be read in this light and are not to be understood as admissions about what is or is not prior art.

Nowadays, electronic signals with large bandwidths, above 1 GHz, are relevant to variety of different applications. As part of generating such signals, due to limitations of strictly electronic circuits and lack of such limitations in optical systems, optical-to-electronic conversion is now commonplace. For applications in radar and communications systems, waveforms designed with specific radio frequency characteristics would be useful. In particular, ultra-broadband arbitrary radio frequency (RF) waveforms with large time-bandwidth product (TBWP) are relevant to a variety of these applications including radar imaging and high-data rate covert wireless communications. Due to limits associated with digital-to-analog converters, electronic arbitrary waveform generation (AWGs) have a restricted RF bandwidth. Although recent developments have increased bandwidth approaching 18 GHz, electronic solutions suffer large timing jitter and further it may be difficult to deploy in harsh environments characterized for example by high electromagnetic interference (EMI). On the other hand, photonics approaches are generally immune to EMI, thereby in a position to provide ultra-broad bandwidth and support various applications.

In particular, photonic radio-frequency (RF) arbitrary waveform generation based on spectral shaping and frequency-to-time mapping has received substantial attention. This technique, however, is critically constrained by the far-field condition which imposes strict limits on the complexity of the generated waveforms. While a more in-depth discussion is provided below, in the body of the specification, a brief discussion is provided in this section to assist the reader in understanding the unmet need in this area. Analogy is made to electromagnetic radiation from an antenna for simplicity.

Suppose an electromagnetic radiation emanates from an antenna. The radiation is divided typically into three zones: near field, transition field, and far field. The near field zone is typically divided into two sub-zones: reactive and radiative. For antennas physically smaller than half of the radiated wavelength, the length of the reactive zone is typically identified as wavelength/$2\pi$ (where wavelength is inversely proportional to frequency of the electromagnetic radiation). The length of the entirety of the near field is one wavelength. The transition zone is typically identified as another wavelength. Therefore, the far field begins at two times the wavelength and extends to infinity. For antennas physically larger than half a wavelength, the near versus far field is defined based on the Fraunhofer distance (Far field distance) which can be defined as $2D^2/\lambda$ where D is the maximum dimension of the antenna and $\lambda$ is wavelength. In electromagnetic radiation in the far field, the power (i.e., the intensity) is inversely proportional with square of the distance from the source. More importantly, in the far field zone, the waves are typically uniform and are typically undisturbed by the medium. In major contrast, in the near field, interaction with the medium can cause energy to deflect back to the source and further cause a distortion in the electromagnetic wave that deviates significantly from that found in vacuum. Such distortions are problematic for near field operations.

Similarly in optical systems, near field operations suffer from distortion. In particular, and as will be discussed further in the body of the specification, the bandwidth of an undistorted electrical signal after the photonic signal has been converted to an electrical signal is about 0.25 times the finest optical spectral resolution. This relationship is a consequence of the far field limitation. Therefore, as discussed above, if a high bandwidth electronic signal is desired, the finest spectral resolution can only be 4 times the desired bandwidth. For example, a 40 GHz bandwidth requires the finest resolution to be 160 GHz. However, such a course resolution limits one from exploiting the full time bandwidth product (TBWP) available from modern equipment (e.g. Fourier Transform Pulse Shapers).

Therefore, a new arrangement and method are needed to address the unmet need of generating high fidelity waveforms with radically increased TBWP that do not suffer from the far field limitation.

SUMMARY

A photonic waveform generator is disclosed. The generator includes an input port for receiving an optical signal. The generator further includes a pulse shaper coupled to the input port and configured to Fourier transform the optical signal and apply a pre-distort waveform onto optical spectrum of the optical signal resulting in a shaped optical signal having both optical amplitude and optical phase spectral shaping. Additionally, the generator includes a dispersive pulse stretcher coupled to the pulse shaper and configured to provide a frequency dependent delay which disperses the shaped optical signal. Furthermore, the generator includes an optical-to-electrical converter coupled to the dispersive pulse stretcher and configured to convert an optical input corresponding to the dispersed shaped optical signal to an electrical output. The generator also includes an output port coupled to the optical-to-electrical converter and configured to output an electrical signal corresponding to the electrical output. The pre-distortion of the transformed optical signal removes distortion of the electrical signal that exists in the absence of the pre-distortion caused by violation of far field limitation between the optical signal and the electrical signal.

A method for generating an electrical pulse with controlled spectral characteristics. The method includes receiving an optical signal, Fourier transforming the optical signal using a pulse shaper to generate a transformed optical signal, pre-distorting the transformed optical signal to generate a pre-distorted transformed optical signal, and stretching the pre-distorted transformed optical signal through a dispersive pulse stretcher. The method further includes converting the stretched pre-distorted transformed optical signal to an electrical signal by an optical-to-electrical converter. The pre-distortion of the transformed optical signal removes distortion of the electrical signal that exists in the absence of the pre-distortion caused by violation of far field limitation between the optical signal and the electrical signal.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the following description, numerous specific details are set forth in order to provide a thorough understanding of the present disclosure as set forth in the claims, which, however, may be practiced without some or all of these specific details. In other instances, well known process operations have not been described in detail in order not to unnecessarily obscure the description.

A novel system and method is described which utilizes amplitude and phase programmability of a shaper to overcome limitations imposed by the far-field requirement and achieves waveforms with maximum available time-bandwidth product (TBWP).

A photonic waveform generator and method of generating electronic waveforms is described which permits the synthesis of a desired electrical waveform having arbitrary time-based characteristics. The use of such waveforms in various systems is described. The characteristics of the electrical waveform to be generated may conform to specific bandwidths, center frequencies and spectral shapes which are suitable for the intended use. In some generated waveforms, the spectral phase may also be controlled.

Electrical waveforms having specifiable characteristics, such as spectral shape, spectral phase and time duration are applicable to, for example, radar, telecommunications, and sensing systems. Broadband electromagnetic systems may be designed to conform to power spectral density, duration, bandwidth or the like and to use waveforms whose characteristics optimize a detected or demodulated signal-to-noise ratio with respect to design constraints. Such waveforms can be generated when the waveform generator is capable of producing effectively arbitrary waveforms, which, for example, can include waveforms which may have properties of maximizing an average power for a peak-power-limited generator or transmitter while meeting specific bandwidth requirements. Where the term "arbitrary" is used in describing a signal or waveform, it will be understood by a person of skill in the art that what is meant is the ability to control the signal or waveform parameters with respect to amplitude, phase, frequency and time essentially independently, within the constraints of physical realizability.

Fourier transform or other known methods of characterizing and specifying the temporal or spectral waveforms described herein are described generally as time-to-frequency or frequency-to-time transformations as are used in methods of signal analysis, filter design, and the like, which are known to persons of skill in the art. Therefore, the details of performing the mathematical operations required are usually not presented herein. Equally, the mathematical equivalence of frequency and time variation representations of a signal and the use of convolution or multiplication of functions are well known and may be interchangeable in the spectral and time domains. These design tools may be used in the apparatus, methods and systems described herein to produce an electrical waveform meeting specific design criteria.

A photonic waveform generator may be comprised of a broadband optical source having pulse characteristics, an optical spectrum shaper, an optical frequency-to-time converter, such as a dispersive pulse stretcher, and an optical-to-electrical converter, such as a photodetector. Alternatively, the pulsed optical source may be external to the photonic waveform generator. In an aspect, the signal spectral design may be performed by specifying the desired signal spectrum. The spectral characteristics desired may be transformed into a time-based domain by an inverse Fourier transform in order to obtain a time-based waveform resulting in the desired spectral characteristics. Accordingly, the optical spectrum pulse shaper and the optical frequency-to-time converter may be configured such that the output power of the optical frequency-to-time converter represents the desired electrical waveform. The combination of an optical spectrum shaper and the optical frequency to-time converter may be termed a photonic waveform generator or photonic signal generator. Photonic signal generators may include transmission- and reflection-type Fourier transform (FT) pulse shapers. It should be appreciated that the phrases pulse shaper and waveshaper are used interchangeably herein, in the present disclosure. Therefore, in addition to the embodiment of a pulse shaper illustrated by FIG. 1b, other embodiments are also possible known to a person having ordinary skill in the art. For example, for the purposes of the present disclosure, commercial products, such as the FINISAR WAVESHAPER 1000s and other members of the FINISAR WAVESHAPER product family, are understood to be possible pulse shaper embodiments.

According to one embodiment, the optical signal output from the photonic signal generator is caused to impinge on an optical-to electronic converter, the output therefrom being an electrical signal having characteristics associated with a time-based waveform of the optical signal input thereto. The temporal properties of the waveform also may be specified directly. According to one embodiment, the FT spectral shaper may be used to modify the spectral amplitude of the optical pulse such that it exhibits an appropriate optical spectral shape, corresponding to the envelope of the temporal electrical signal desired, and the optical frequency-to-time converter disperses the optical energy with respect to a time base, such that the amplitude characteristics of the optical signal correspond to the temporal properties of the electrical waveform desired.

Figure 1A:
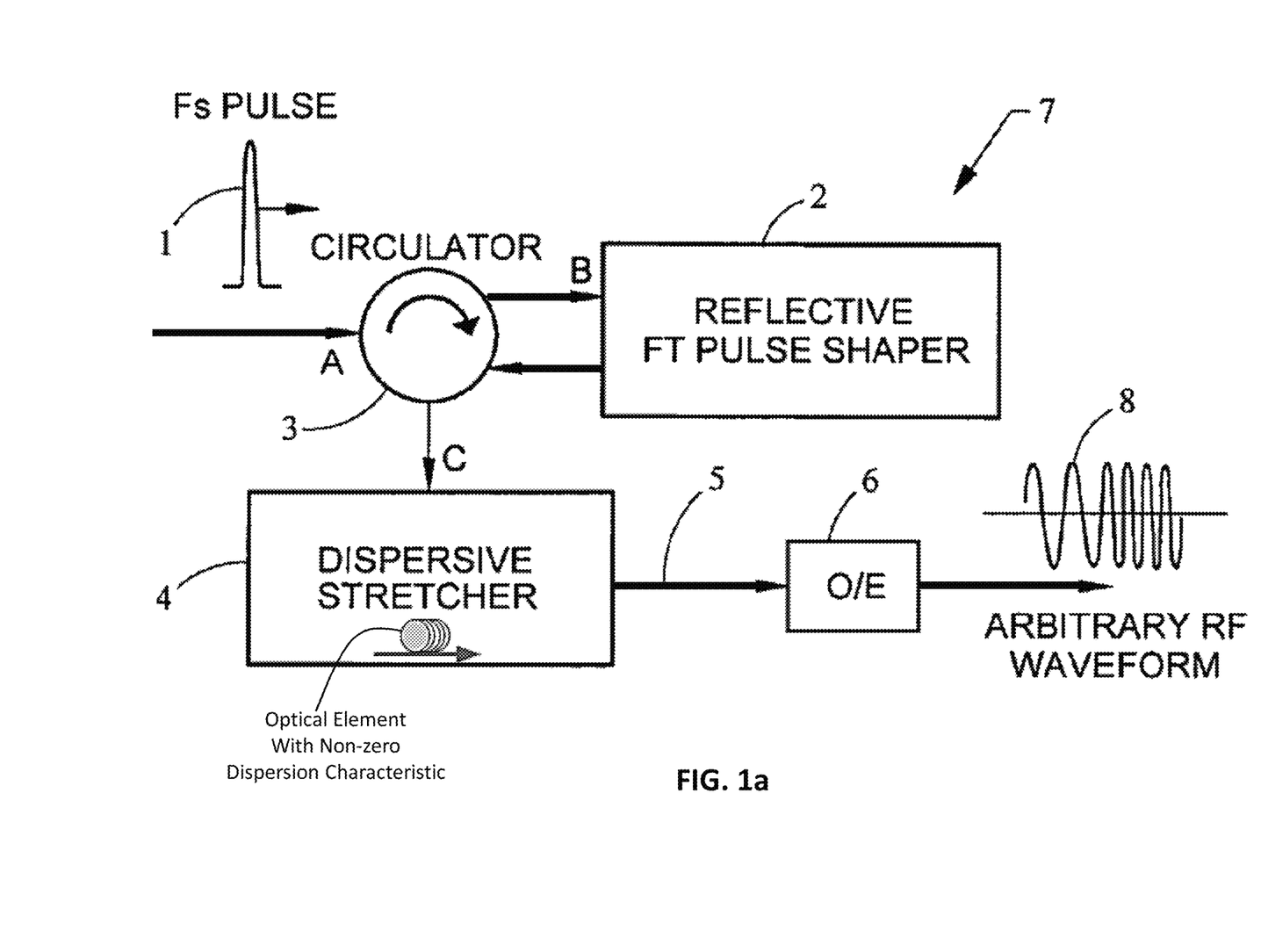
FIG. 1a is a schematic of a photonic waveform generator according to one embodiment of the present disclosure, including a pulse shaper.

Referring to FIG. 1a, an exemplary schematic of a photonic waveform generator 7 is provided. A desired temporal electrical waveform may be generated as shown in FIG. 1a. A short optical pulse 1 is introduced into the photonic waveform generator 7 through port A of the circulator 3. The pulse may be optical energy from any of a variety of optical sources, and the pulse may be amplified by, e.g., an erbium-doped fiber amplifier (EDFA), semiconductor optical amplifier (SOA), or the like. The optical signal may have a typical bandwidth of, e.g., about 35 nm and a time duration of, e.g., about 100 fs. The short optical pulses are output through port B of the circulator 3 and introduced into a reflective-type Fourier transform (FT) pulse shaper 2. The optical amplitude spectrum of the pulse 1 is modified in accordance with the desired resultant electrical waveform by the FT pulse shaper 2 and is output from the FT pulse shaper 2 to the circulator 3. The modified optical spectrum passes through the circulator 3 and output through port C into the dispersive pulse stretcher 4. The dispersive pulse stretcher 4 may be an optical fiber having chromatic dispersion such that energy at differing optical frequencies simultaneously input at a proximal end of the fiber are output from a distal end of the fiber with a time difference therebetween, having a time-difference dependence which is related to the optical frequency difference therebetween. Other dispersive media and techniques may be used for optical pulse stretching, providing that the transmission bandwidth is greater than that of the optical signal spectrum width. These include gratings, prisms, virtually imaged phased arrays (VIPAs), or pairs thereof, chirped fiber Bragg gratings, and the like. Using pairs of gratings, and the like, may also be a means of optical frequency-to time conversion.

Figure 1B:
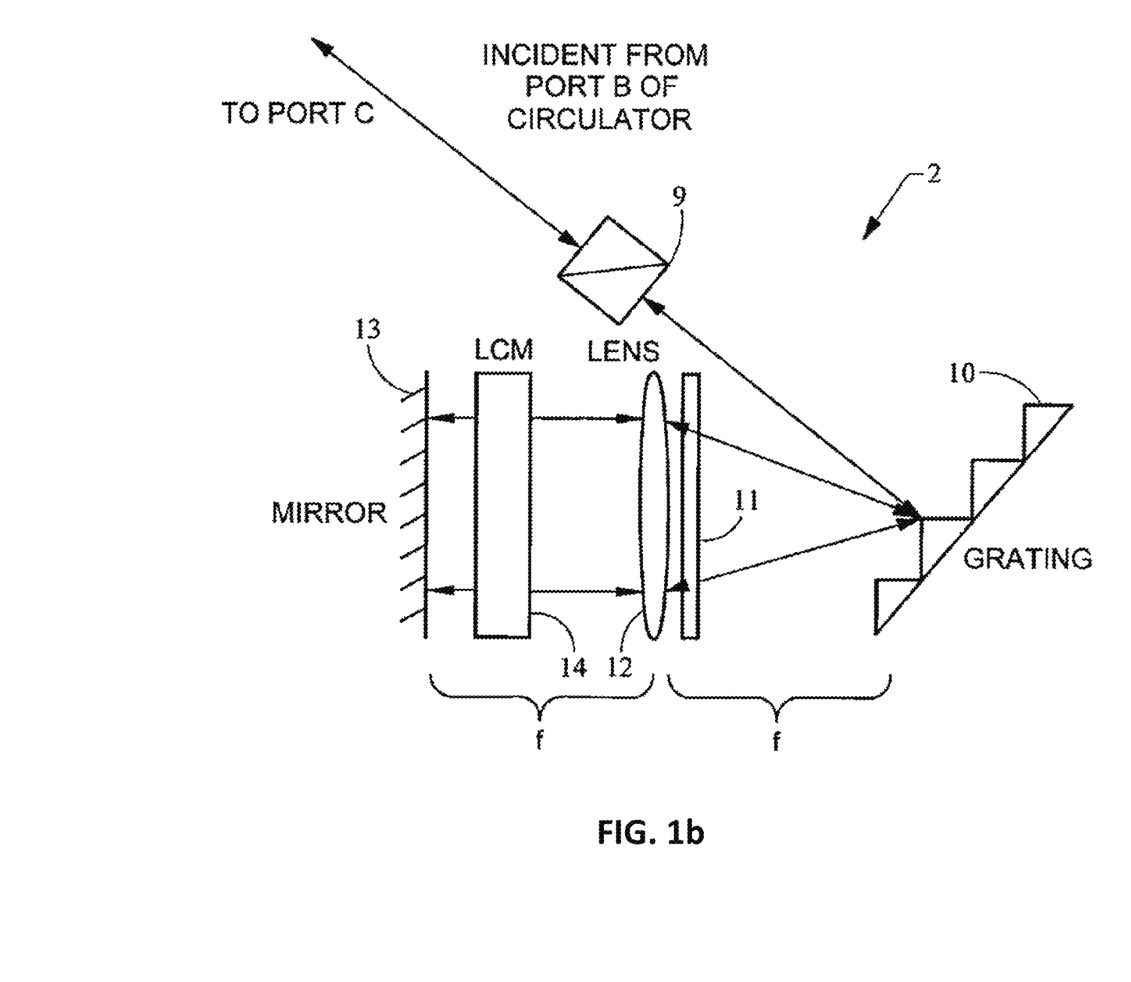
FIG. 1b is a schematic of the pulse shaper of FIG. 1a, according to one embodiment of the present disclosure.

The temporal characteristics of the optical power in the time-dispersed optical spectrum at the output 5 of the dispersive stretcher 4 represent an optical equivalent of the electrical waveform desired. The combination of a reflective FT pulse shaper and a dispersive stretcher may be considered as an example of a photonic waveform generator 7. However, the photonic waveform generator may also include other related components such as the optical to electronic (O/E) conversion means, e.g., an optical-to-electrical converter. Components such as the dispersive stretcher 4 and the reflective FT pulse shaper 2 are shown as separate modules for clarity of explanation. A person having ordinary skill in the art will appreciate that each of the components in FIG. 1a, and subcomponents such as shown in FIG. 1(b) may be arranged in a variety of physical configurations to produce the same resulting signal. Referring to FIG. 1b, a schematic representation of the arrangement of the components of pulse shaper of FIG. 1a is provided. Where a pulse shaper and a dispersive stretcher are used, the positions of the pulse shaper and the dispersive stretcher may be interchanged with respect to the photodetector.

The optical signal output from the pulse shaper and dispersive network may be caused to impinge on an optical-to-electrical (O/E) converter 6 such that the optical signal is converted into an electrical voltage 8. The O/E converter 6 may be a photodetector, photomultiplier, photoconductive antenna, or the like. The reflective FT pulse shaper 2 shown in FIG. 1b is used to impose a spatial spectral-amplitude modulation onto each optical pulse. A reflective-type FT pulse shaper has an advantage of minimizing the number of components with respect to a transmission-type pulse shaper, and by being substantially self-aligning.

As is known to a person having ordinary skill in the art, the spectral characteristics of an optical signal may be described as a function of optical frequency or a function of optical wavelength, one being proportional to the inverse of the other. Herein either means of description may be used. Modification of the optical input spectrum by the FT pulse shaper 2, results in spatial amplitude modulation in the optical wavelength (frequency) domain, but may not be a temporal modulation. That is, the frequency dependence of optical power at each optical frequency may be modified, but the optical frequency spectrum may be substantially non-time-varying within an optical pulse. The relative optical power at each specific optical frequency is modified. Modification of the optical input spectrum by the FT pulse shaper 2, results in spatial (spectral) amplitude modulation in the optical wavelength (frequency) domain. Typically the various optical wavelengths (frequencies) are recombined at the output of the FT pulse shaper 2 to yield an output signal that is spectrally modulated but no longer substantially spatially modulated.

Alternatively, modification of the optical input spectrum by the FT pulse shaper 2, may result in spatial phase modulation or both spatial phase and amplitude modulation in the optical wavelength (frequency) domain. When the various optical wavelengths (frequencies) are recombined at the output of the FT pulse shaper 2, this gives rise to an output optical waveform whose shape depends on the Fourier transform of the spatial phase and/or amplitude pattern transferred onto the spectrum.

As shown in the example of FIG. 1b, the FT pulse shaper 2 may include a polarization beamsplitter 9, a diffraction grating 10, a half-wave plate 11, a lens 12 having a focal length f, a reflecting surface, which may be a mirror 13, and a liquid crystal display modulator (LCM) 14. The LCM 14 is disposed between the lens 12 and the mirror 13. The combination of the mirror 13, the LCM 14 the half-wave plate 11, and the polarization beamsplitter 9 performs a function equivalent to a reflective-type liquid crystal display (LCD), by spatially modulating an incident light source. The diffraction grating 10 spatially disperses the input optical waveform such that it mapped into a spatial distribution of optical energy impinging on the liquid crystal display modulator (LCM) 14, and each optical frequency corresponds to a physical location on the surface of the LCM 14.

The amplitude of the optical energy transmitted through the LCM 14 may be modified by altering the spatial transmission properties of the LCM 14 such that the transmission characteristics at each spatial location corresponds to the desired modification of the corresponding optical spectral amplitude, taking account of the passage of the optical energy back through the LCM 14 and half wave plate 11 after reflection by the mirror 13. The optical spectral resolution of the FT pulse shaper 2 is limited by the granularity of the LCM 14 and the spot size of the beam of optical energy. The optical spectral modulation may be static during the duration of a single optical pulse, but may be varied from pulse-to-pulse, limited only by the temporal response of the LCM 14.

The spectrally modified optical pulse passes through the lens 12 and is diffracted by the diffraction grating 10 such that the light energy is directed back through the polarization beamsplitter 9 and thus exits the FT pulse shaper 2 in a path direction opposite from, but substantially collinear with, the input path. The optical energy may be input to the pulse shaper using an optical fiber, bulk optics or the like. Typically, the spatially modulated optical spectrum energy is reintroduced into the fiber or other input means before being directed into the dispersive optical stretcher. In this state, at the output of the FT pulse shaper 2, the optical energy dependence on wavelength has been modified such that it represents the amplitude of the desired electrical waveform. However, the optical energy has a temporal aspect which is related to the input temporal properties of the optical waveform; that is, a very short pulse, and this characteristic may be altered in a dispersive pulse stretcher, if needed.

When the spatially-modulated spatially dispersed optical spectrum of the input optical pulse is output from the pulse shaper, the optical energy may have been reintroduced into an optical waveguide such as a fiber, and no longer be spatially dispersed, and so it is equally possible to term the optical energy at this point in the apparatus as being a modulated optical spectrum, as the spatially dispersed aspect is only an intermediate aspect of the transformation. Similarly, the spatially-dispersed optical spectrum is amplitude and phase modulated by a waveform to form the modulated spectrum, but the phase and amplitude modulation in the pulse shaper is in the spatially dispersed optical spectral domain rather than the electrical amplitude domain. In the example of FIG. 1b, the LCM is the means of phase and amplitude modulation of the spatially dispersed optical spectrum and the diffraction grating and lens are the means of spatial dispersion of the optical spectrum.

The spectrally modified (modulated) optical pulse output to the circulator 3 by the FT pulse shaper 2 may be directed into a dispersive optical pulse stretcher 4 through port C of the circulator 3. The dispersive optical pulse stretcher 4 may be a fiber exhibiting chromatic dispersion, but chirped fiber gratings, or bulk optic equivalents may be also used. That is, the time delay associated with traversal of a fixed length of optical fiber, or the bulk optical equivalent thereof, is a function of optical wavelength. Fibers with positive dispersion, negative dispersion and, locally, no dispersion are known. The dispersion characteristics of the fiber or other dispersive medium used in the dispersive pulse stretcher 4 are those characteristics exhibited within the bandwidth of the optical energy of the optical pulse. A person having ordinary skill in the art will appreciate that the dispersion characteristics of a medium may change with wavelength and other physical factors such as temperature or pressure; thus, a different dispersion characteristic may be obtained at frequencies not within the optical wavelength regime of the pulse.

The sense of dispersion, the dispersion per unit length of the fiber, and the length of fiber are selected such that the optical signal may be transmitted through the fiber and exits the fiber with a relative time delay which depends on the optical wavelength of each component of the optical spectrum of the pulse. In this manner, an optical wavelength of the component optical energy may be related to a wavelength-dependent relative time delay and, as the relative time delay is a function of optical wavelength, the optical signal may have time-delay dispersion. The dispersion characteristic may be expressed, for example, in ps/nm/meter, where wavelength is expressed in nanometers, and the length of the fiber is in meters.

If the far field condition is satisfied, the dispersive pulse stretcher 4 has the effect of mapping the spectral power distribution to a temporal power distribution through-the-dispersive transformation, the so called frequency-to-time mapping. That is, envelope of the optical energy waveform is the resultant of the spatial modulation of the input optical pulse 1 in the wavelength domain by the FT pulse shaper 2, and the subsequent dispersion of the optical signal in the time domain by the dispersive optical pulse stretcher 4. The optical energy temporal waveform at the output 5 of the dispersive pulse stretcher 4 represents the temporal characteristics of the desired electrical pulse 8. As will be explained later, the far-field condition imposes strict limits on the complexity of the generated waveforms.

The optical energy output from the dispersive pulse stretcher is converted to an electrical signal in, for example, a photodetector 6, where the electrical current signal output 8 is proportional to the instantaneous optical power input thereto. A photodetector 6 may have the effect of converting the optical signal within the detection bandwidth of the photodetector 6 into a current proportional to the instantaneous power of the optical signal. In this manner, an electrical signal 8 may be generated possessing substantially the same temporal characteristics as the time-dispersed optical energy impinging on the photodetector 6. This electrical signal 8 may be further transformed into a voltage in, for example, a transimpedance amplifier, and amplified and further processed by amplifiers, filters and other electrical and radio frequency circuit components. The amplification and further processing of an electrical signal is well known in the art, and all of the known techniques, or techniques which may be subsequently be developed, for radio frequency processing and transmission may be used in conjunction with the signal 8, which has been generated by the photonic generator and opto-electronic converter.

While an LCM has been described as an exemplary device for modifying the optical spectrum by varying the transmission characteristics of the LCM, it should be appreciated that other devices may be used to vary the spatial transmission in an FT pulse shaper. In circumstances where the properties of the waveform are not intended to be changed with time (that is, the time scale involved is a multiple of the pulse repetition interval, or the waveform characteristics are fixed during the design process), the LCM may be replaced with an optical mask whose spatial variation of transmission characteristics corresponds to, for example, one or more data configurations of the LCM which represent the desired spatial transmission characteristics in phase, amplitude or both.

The design of electrical waveforms may encompass a variety of characteristics such as bandwidth, center frequency, spectral shape, and spectral phase, depending on the intended use. Specific temporal-electrical waveforms may achieve a particular transmitted radio-frequency spectral distribution, and spectral phase may be used in order to uniquely specify the radio frequency waveform, although this is not required for every type of use.

Optical pulse 1 has a finite time duration at the input to the waveform generator 7. The effect of the finite pulse duration on the shape of the electrical waveform is to weight the overall optical spectrum and thus the electrical waveform, and this effect may be accommodated in the waveform design. That is, it is known in the art that an ideal impulse has a theoretically infinite bandwidth and a flat spectral distribution. Actual impulses may be very short in time duration, but as the time duration is finite, the corresponding spectrum also has a finite extent. As such, the spectrum of the optical energy may have a slow variation with wavelength.

It should be appreciated that the power in the optical signal is greater or equal to zero at all time during the duration of the pulse. Yet, many signals to be generated have sinusoidal aspects which are oscillatory in nature, and would ordinarily have both positive and negative voltage or current components at various times during the duration thereof. One way of accommodating this is to add a sufficient DC pedestal to the optical intensity being generated such that the optical intensity at the input to the detector 6 accommodates the oscillatory nature of optical waveform corresponding to the time-domain signal while maintaining the optical energy greater than or equal to zero. This has the effect of imposing a DC pedestal on the resultant electrical time-domain signal produced at the output of the detector 6 by the detection of the modulated time-dispersed optical signal pulse.

The effect of the optical DC offset is to produce an electrical signal component at zero frequency, and as this DC offset is of finite time duration, corresponding to substantially the duration of the pulse, spectral leakage of the DC component occurs. This may be mitigated by amplitude weighting the optical spectrum; that is, by apodizing. A variety of apodizing functions are known in the art of spectral processing and may include, Gaussian, Hanning, Hamming, and Taylor weighting, triangular weighting, and the like. An electrical signal may therefore be generated and positioned at an arbitrary center frequency by amplitude modulating the optical spectrum in a sinusoidal manner with optical frequency so that, when transformed into the time domain through the dispersive optical stretcher, the resultant electrical signal has a sinusoidal oscillation at the desired center frequency. This is most effectively done by apodizing the optical waveform by amplitude modulating the optical spectrum in a FT pulse shaper.

When the apodized optical spectrum is transformed by the dispersive line and converted into an electrical signal, the spectral weighting mitigates the spreading of energy of the DC pulse such that the desired spectrum can be observed with less influence of the DC spectral sidelobes. At this juncture, the low frequencies associated with the DC pulse sidelobes can be suppressed by electrical filtering, typically associated with amplifiers, filters and antennas. In addition to managing the spectral broadening due to the DC pedestal, apodization may be used to compensate for optical spectral variations due to, for example, the characteristics of the optical source and the finite time duration of the pulses.

The desired electrical waveform spectral shape, and the spectral phase if also desired, may be inverse Fourier transformed in order to define a time-domain waveform meeting the spectral requirements. A DC level is added to the resultant optical signal so that the temporal optical intensity is greater than or equal to zero during the pulse duration. The electrical signal frequency spectrum may be shifted to a desired center frequency by amplitude modulating the time-domain waveform obtained by the zero frequency design process with a sinusoidal signal having the desired center frequency. The value of the DC level is dependent on the specific time-domain waveform being synthesized.

However, as described in the background section, to satisfy the far-field condition in the frequency-to-time mapping, the electrical signal provided by the photodetector suffers from the far field limitation (i.e., bandwidth of the signal is limited to the 0.25 times the finest spectral resolution of the system which is typically driven by the resolution of the pulse shaper 2).

Figure 2:
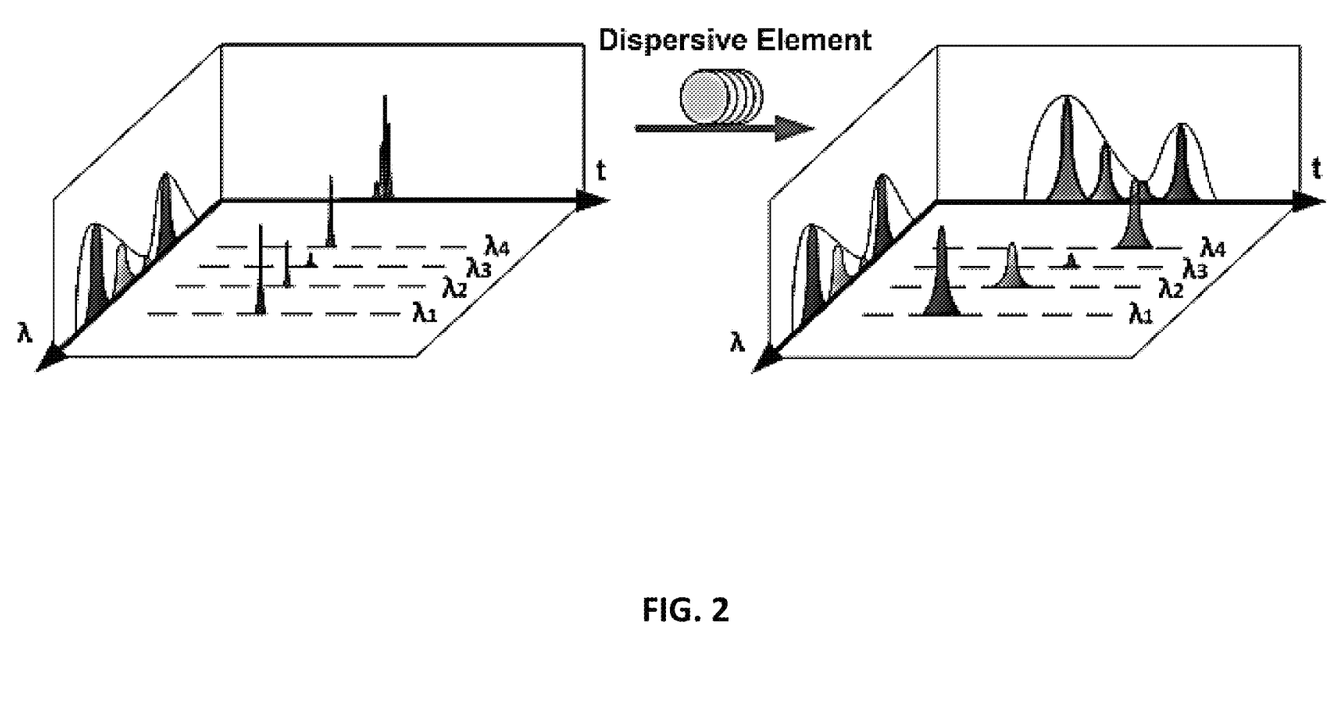
FIG. 2 represents two graphs of wavelength vs. time, the left graph represents the temporal relationship before dispersion effect of a dispersive element, while the graph on the right represents the temporal relationship after dispersion effect of a dispersive element.

Referring to FIG. 2, conceptual plots of wavelength vs. time for before and after dispersive element of FIG. 1a are provided. The desired RF waveform can be programmed onto the optical power spectrum using a pulse shaping element, as described with respect to the discussion provided above with respect to FIG. 1a. The shaped pulses can then be stretched in a dispersive medium where the chromatic dispersion provides the so called frequency-to-time mapping phenomenon. Mathematically, the transformation of a pulse propagating in media with group delay dispersion ($\psi_2$) can be expressed by the Fresnel integral:

$$a_{out}(t) \propto \exp\left(-j\frac{t^2}{2\psi_2}\right)\int_{-\infty}^{+\infty} a_{in}(t')\exp\left(-j\frac{t'^2}{2\psi_2}\right)\exp\left(j\frac{tt'}{\psi_2}\right)dt' \quad (1)$$

where $a_{in}(t)$ and $a_{out}(t)$ are respectively the complex envelopes of the signals before and after the dispersive medium. Here, the group delay dispersion is defined as $$\psi_2 = -\frac{\partial^2 \beta(\omega)}{\partial \omega^2}L$$

where $\beta(\omega)$ is the propagation constant in the medium with length L. In some applications, notably fiber optics the fiber dispersion is usually described in terms of a dispersion parameter D with units ps nm$^{-1}$ km$^{-1}$, related to the group delay dispersion as $\psi_2=(\lambda^2 D)/(2\pi c)L$ where $\lambda$ is the wavelength and c is the speed of light.

To facilitate later discussion, the notation $a_{FTM}(t)$ is introduced to denote the shaped input field $a_{in}(t)$ associated with the frequency-to-time mapping method. When the far-field limit is satisfied, the quadratic factor $\exp(-jt^2/2\psi_2)$ in equation (1) is negligible, and the output intensity profile is simply a scaled replica of optical power spectrum, i.e., $$|a_{out}(t)|^{\substack{Far\ Field\\ \propto\\ Limit}} \left|\exp\left(-j\frac{t^2}{2\psi_2}\right)\int_{-\infty}^{+\infty} a_{FTM}(t')\exp\left(j\frac{tt'}{\psi_2}\right)dt'\right|^2 = \quad (2)$$

$$|A_{FTM}(\omega = -t/\psi_2)|^2.$$

where $A_{FTM}(\omega)$ is the Fourier transform of $a_{FTM}(t)$. Here, the Fourier transform of a function $f(t)$ is expressed as $F(\omega)=\int f(t')\exp(-j\omega t')dt'$. For RF-AWG, the input power spectrum is shaped as $|A_{FTM}(\omega=-t/\psi_2)|^2$, which is taken to be equal to the desired RF waveform $|a_{out}(t)|^2$, appropriately scaled. Eq. (2) indicates that when the far-field limit is satisfied, the spectral phase of $A_{FTM}(\omega=-t/\psi_2)$ can be arbitrarily chosen The spectral shape (that is, the envelope of the signal energy as a function of frequency or wavelength) of a generated signal waveform may be determined by defining the spectrum about DC, to include the spectral shape and bandwidth. The spectral shape may be a known function, a regulatory specification, a waveform optimized to detect a target or to overcome the distortions of the transmission and reception processes, or intended for communications purposes (such as intra-pulse phase-shift keying). After defining the spectral shape, the spectral phase may also be specified. A combination of the spectral amplitude and spectral phase may uniquely define the time-domain waveform corresponding thereto. Alternatively, a number of different time-domain waveforms may be synthesized having the same radio frequency spectrum, but differing spectral phase.

In order to meet the far-field condition, the phase variation of the quadratic factor $\exp(-jt^2/2\psi_2)$ within a time duration equal to the inverse of the finest spectral feature placed onto the input spectrum should be $<\pi/8$. This sets a minimum dispersion requirement and imposes strict limits on the complexity and bandwidth of the achievable RF waveforms. The maximum RF bandwidth ($B_{RF}$) that can be achieved using Frequency-to-time mapping (FTM) to generate arbitrary non-distorted waveforms is proportional to the finest spectral resolution ($\delta f$) used in the pulse shaper (as discussed in the background section, the far field limitation):

$$B_{RF} < 0.25 \times \delta f \qquad (3)$$

Equation (3) shows that in conventional frequency-to-time mapping, coarse spectral resolution is required if arbitrary electrical waveforms are to be generated with both high frequency content and high fidelity (low distortion). This relationship imposes a limitation for exploiting the full TBWP available from modern pulse shapers. Although experiments reaching bandwidth beyond the limit presented in equation (3) have been reported, the failure of these experiments to satisfy the far-field condition and the consequent significant loss of fidelity to generate arbitrary RF waveforms has apparently gone unnoticed. The limits of conventional FTM are investigated with an experiment in which it is sought to generate a down-chirp waveform over frequencies from approximately baseband to 41 GHz by shaping pulses from a mode-locked fiber laser over a 40 nm bandwidth.

In one embodiment, according to the present disclosure, an erbium-doped fiber ring mode-locked laser with repetition rate of ~50 MHz and wavelength range of ~1520 nm-1610 nm is used as the input source. The laser pulses are shaped with a commercial pulse shaper (FINISAR WAVESHAPER 1000s) with spectral resolution of ~10 GHz and operating wavelength range of 1527.4 nm-1567.4 nm. The output pulses are stretched in ~10.3 km of single mode fiber (total dispersion of ~170 ps/nm) for experiments for which results are provided in FIGS. 3a-3f. The RF signal is detected by a high-speed photodetector with bandwidth of ~50 GHz. A digital sampling oscilloscope and an RF spectrum analyzer with respective bandwidths of 60 GHz and 50 GHz are used to characterize the generated RF waveforms in time and frequency. The optical spectrum is also measured with an optical spectrum analyzer with spectral resolution of 0.01 nm. The dispersion is chosen to yield a time aperture of ~6.8 ns, corresponding to a TBWP of ~280.

Figures 3A, 3B, 3C, 3D, 3E, 3F:
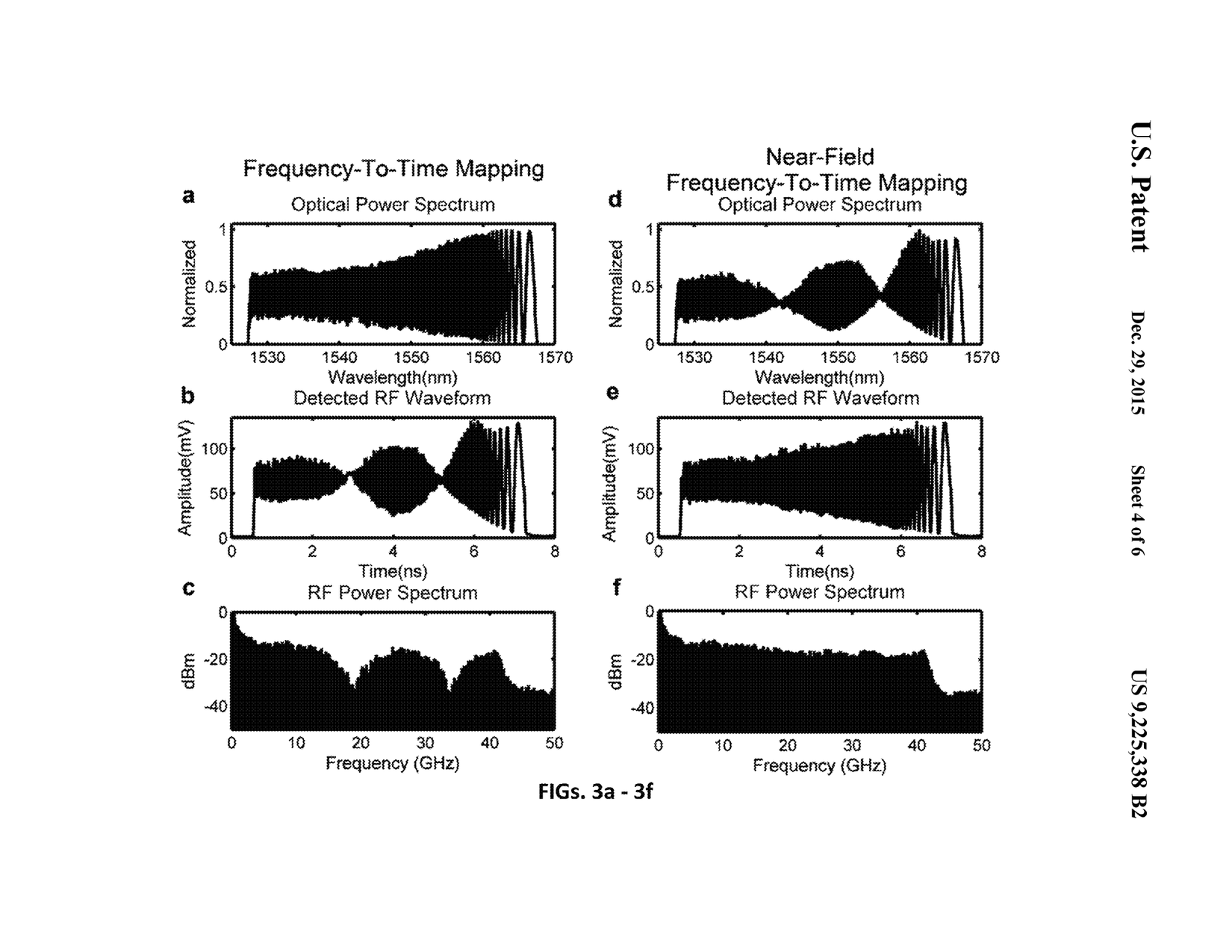
FIGS. 3a-3c are normalized power spectrum vs. wavelength (measured in nm) of an input optical signal (FIG. 3a); amplitude (measured in mV) vs. time (measured in ns) for a converted electrical signal from the corresponding optical signal (FIG. 3b); and power spectrum (measured in dBm) vs. frequency (measured in GHz) for the converted electrical signal (FIG. 3c), respectively.
FIGS. 3d-3f are normalized power spectrum vs. wavelength (measured in nm) of an optical signal that is pre-distorted (FIG. 3d) based on near-field frequency-to-time mapping; amplitude (measured in mV) vs. time (measured in ns) for a converted electrical signal from the corresponding optical signal (FIG. 3e); and radio frequency (RF) power spectrum (measured in dBm) vs. frequency (measured in GHz) for the converted electrical signal (FIG. 3f), respectively; resulting in an undistorted chirp signal and the RF spectrum extends smoothly out to ~41 GHz with less than 5 dB roll-off with respect to the 4 GHz frequency components.

However, in the case for which the variation of the quadratic phase term within the integral of equation (1) reaches ~1.84π, the far-field criterion is strongly violated. Such a violation is shown in FIGS. 3a-3c. In particular, referring to FIGS. 3a-3c, waveforms from a conventional (i.e., with the far field limitation badly violated) frequency-to-time mapping are depicted. Generated RF waveform is badly distorted and certain RF frequencies are strongly attenuated. The range of the wavelengths are from about 1525 nm to about 1565 nm resulting in frequencies of up to about 41 GHz, resulting in a time-based signal of up to about 7 ns. As seen in FIGS. 3b and 3c, there are considerable amount of distortion associated with the violation of the far field limitation. For example, while a relatively flat the spectrum is desired, the spectrum shown in FIG. 3c is completely distorted. To comply with the far-field condition, equation (3) indicates that in order to synthesize an RF waveform with spectrum up to 41 GHz, the pulse shaper should be programmed with super-pixels with minimum resolution of ~164 GHz, much coarser than the ~10 GHz spectral resolution capability of the pulse shaper. This resolution can reduce the maximum possible TBWP of the synthesized waveform to <17 for frequency-to-time mapping free of significant distortion.

Figure 4:
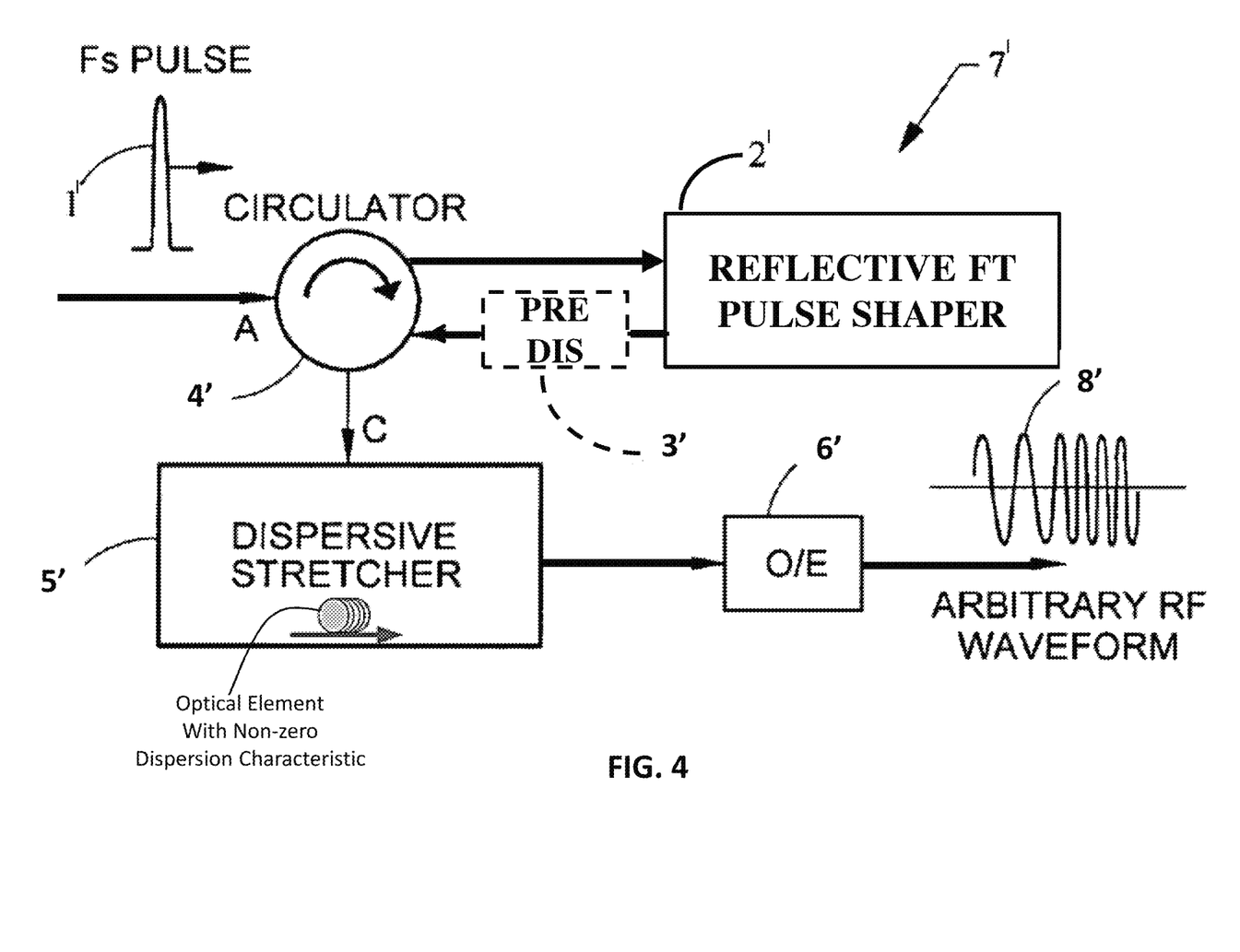
FIG. 4 is a schematic of a photonic waveform generator according to one embodiment of the present disclosure, including a pre-distortion block.

To correct for the distortion, according to the present disclosure, the optical power spectrum shown is operated in the near field and to avoid distortions of the near field zone, discussed above, the optical signal in the near field is pre-distorted. Referring to FIG. 4, the schematic of FIG. 1a is repeated with a pre-distortion block optionally added (hence provided in phantom lines). The pre-distortion block is optional in that the function of the pre-distortion can be implemented in the FT pulse shaper 2', discussed below. The reference numerals of FIG. 1a are repeated with each reference having a prime indicating the distinctness of the photonic waveform generator 7'. As before, a desired temporal electrical waveform may be generated as shown in FIG. 4. A short optical pulse 1' is introduced into the photonic waveform generator 7' through port A of the circulator 4'. The pulse may be optical energy from any of a variety of optical sources, and the pulse may be amplified by, e.g., an EDFA, SOA, or the like. The optical signal may have a typical bandwidth of, e.g., about 35 nm and a time duration of, e.g., about 100 fs. The short optical pulses are output through port B of the circulator 3' and introduced into a reflective-type Fourier transform (FT) pulse shaper 2. The optical amplitude and spectral spectrum of the pulse 1' is modified in accordance with the desired resultant electrical waveform by the FT pulse shaper 2 and is output from the FT pulse shaper 2 to the circulator 4'. The modified optical spectrum passes through the circulator 4' and output through port C into the dispersive pulse stretcher 5'. The dispersive pulse stretcher 5' may be an optical fiber having chromatic dispersion such that energy at differing optical frequencies simultaneously input at a proximal end of the fiber are output from a distal end of the fiber with a time difference therebetween, having a time-difference dependence which is related to the optical frequency difference therebetween.

The new block is a pre-distortion block 3' which is configured to provide a pre-distortion to the optical signal operating in the near field prior to the circulator 4'. The modified optical spectrum passes through the circulator 4' and output through port C into the dispersive pulse stretcher 5'. The pre-distortion is designed such that the stretched signal out of dispersive pulse stretcher has the optical energy temporal waveform that represents the temporal characteristics of the desired electrical pulse 8'. The desired optical waveform is converted to an electrical signal by the photodetector 6'.

In the approach provided in the present disclosure, referred herein as a Near-Field Frequency-to-Time Mapping (NF-FTM), the pulse shaper is programmed to yield a waveform $a_{in}(t)$ represented by:

$$a_{in}(t) = a_{FTM}(t)\exp\left(j\frac{t^2}{2\psi_2}\right) \qquad (4)$$

whereas mentioned above, $a_{FTM}(t)$ is defined in terms of the target RF waveform assuming frequency-to-time mapping strictly applies. Here $a_{FTM}(t)$ is multiplied by a new quadratic phase term that cancels out the phase factor $\exp(-jt^2/2\psi_2)$ in Eq. (1). As a result the target waveform $|a_{out}(t)|^2$ that appears in the frequency-to-time mapping expression, Eq. (2), is obtained exactly independent of the far-field condition.

Experimentally this condition is realized by reprogramming the pulse shaper according to the Fourier transform of Eq. (4); no new physical device is needed (i.e., the pre-distortion block 3' can be avoided and the pre-distortion taken place in the FT pulse shaper 2').

From another viewpoint, equation (4) is analogous of time lens studies in which physical elements such as electro-optic phase modulators or nonlinear wave mixing generate quadratic temporal phase. However, in the scheme according to the present disclosure the effect of the quadratic temporal phase is computed to arrive at a complex optical spectrum, which can then be programmed in the optical frequency domain. Since there is no physical element providing direct time domain phase, the approach according to the present disclosure can be identified as assisted by a virtual-time-lens. The waveform predistortion prescribed under this method advances the location at which the Fourier transform relation of equation (2) applies from the far-field into the near-field region, enabling generation of waveforms not accessible under the far-field condition.

Returning to FIGS. 3a-3f, FIGS. 3d-3f are equivalent to FIGS. 3a-3c with the optical signals predistorted. In particular, FIG. 3d shows the new optical power spectrum, which now has strong pre-distortions. The shaped field is programmed with spectral phase variation as well (not shown). After dispersive propagation, a time domain RF waveform with desirable chirp is obtained as shown in FIG. 3e, in substantial agreement with the target waveform, see FIG. 3a, appropriately scaled. Removing constraints imposed by the far-field criterion, a TBWP of ~280, near the maximum possible using this pulse shaper, is achieved. The RF spectrum, FIG. 3f, extends smoothly out to ~41 GHz, more than a factor of two beyond the highest frequency available from commercial electronic arbitrary waveform generators. This combination of high RF bandwidth and large TBWP, while maintaining excellent waveform fidelity, is unprecedented in photonic RF-AWG.

Figure 5:
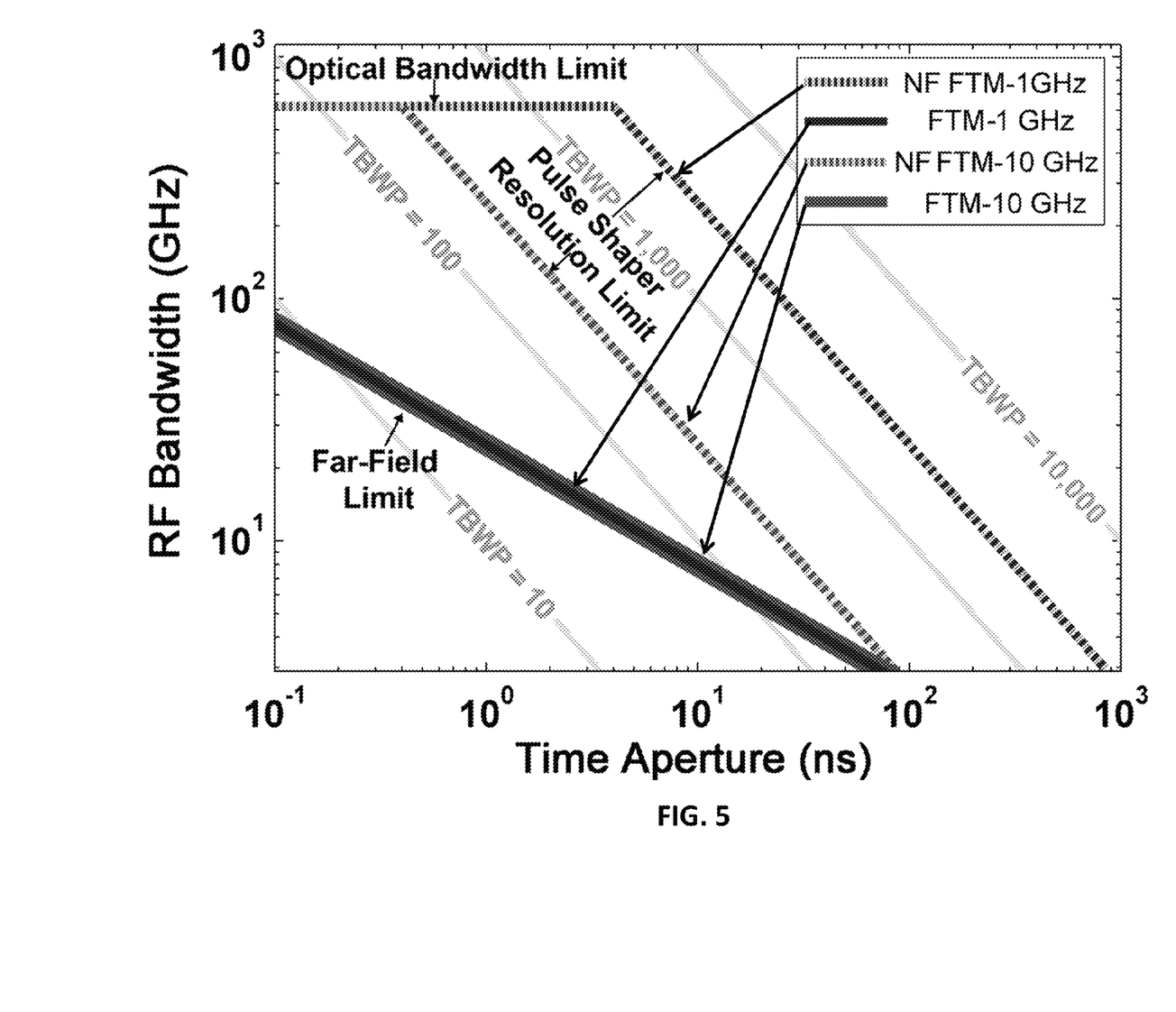
FIG. 5 is a graph of radio frequency RF bandwidth (logarithmically measured in GHz) vs. time aperture (logarithmically measured in ns), where upper bounds of the achievable waveforms based on conventional frequency time mapping (FTM) and near field FTM (NF-FTM) for two shapers with assumed spectral resolutions of 1 GHz and 10 GHz and optical bandwidth of 5 THz are shown.

Referring to FIG. 5, a graph of RF bandwidth in GHz vs. time aperture in ns is provided. In FIG. 5 upper bound estimations of the RF bandwidth and time aperture achievable from FTM and near field FTM (NF-FTM) for an assumed 5 THz optical bandwidth are depicted. The gray lines show the constant TBWP. For the conventional method, the far-field criterion provides a limiting factor; and pulse shapers with better spectral resolution do not yield larger TBWP while maintaining waveform fidelity. In contrast, NF-FTM can take full advantage of the pulse shaper's capabilities. The impact of the approach disclosed herein is especially clear for shapers operating at high spectral resolutions. For example, for a shaper with assumed 1 GHz resolution, a time aperture of 125 ns should be possible for frequencies up to 20 GHz (TBWP of ~2,500), while the time aperture would be limited to 1.56 ns (TBWP<31) for the conventional technique. Note that pulse shapers with resolution well below 1 GHz have already been demonstrated, as have programmable shapers with thousands of individually controllable elements configured in a novel two-dimensional spectral dispersion geometry.

Those skilled in the art will recognize that numerous modifications can be made to the specific implementations described above. The implementations should not be limited to the particular limitations described. Other implementations may be possible.

The invention claimed is:

1. A photonic waveform generator, comprising:
an input port for receiving an optical signal;
a pulse shaper coupled to the input port and configured to Fourier transform the optical signal and apply a pre-distortion waveform onto optical spectrum of the optical signal resulting in a shaped optical signal having both optical amplitude and optical phase spectral shaping;
a dispersive pulse stretcher coupled to the pulse shaper and configured to provide a frequency dependent delay which disperses the shaped optical signal;
an optical-to-electrical converter coupled to the dispersive pulse stretcher and configured to convert an optical input corresponding to the dispersed shaped optical signal to an electrical output; and
an output port coupled to the optical-to-electrical converter and configured to output an electrical signal corresponding to the electrical output,
the pre-distortion waveform of the transformed optical signal removes distortion of the electrical signal that exists in the absence of the pre-distortion waveform caused by violation of far field limitation between the optical signal and the electrical signal,
where the shaped optical signal having both optical amplitude and optical phase spectral shaping is given by $A_{in}(\omega)$,
where $A_{in}(\omega)$ is based on a Fourier transform of the time domain representation $a_n(t)$ of the shaped optical signal, where $$a_{in}(t) = a_{FTM}(t)\exp\left(j\frac{t^2}{2\psi_2}\right),$$

where $a_{FTM}(t)$ is calculated so that the $|A_{FTM}(\omega=-t/\psi_2)|^2$ is equal to the desired electrical signal waveform,
where $A_{FTM}(\omega)$ is the Fourier transform of $a_{FTM}(t)$, and $$\psi_2 = -\frac{\partial^2 \beta(\omega)}{\partial \omega^2}L,$$

where $\psi_2$ is a group delay dispersion of the dispersive pulse stretcher and $\beta(\omega)$ is a propagation constant in a medium in which the optical signal travels, the medium having length L.

2. The photonic waveform generator of claim 1, wherein the optical-to-electrical converter is a photodetector.

3. The photonic waveform generator of claim 2, wherein the photodetector is a photodiode.

4. The photonic waveform generator of claim 1, wherein the dispersive pulse stretcher comprises an optical element having a non-zero dispersion characteristic.

5. The photonic waveform generator of claim 1, wherein the pulse shaper comprises:
a spatial modulator;
an optical grating; and
a reflective surface,
wherein the spatial modulator is a liquid crystal module, disposed between the optical grating and the reflective surface,
wherein the reflective surface is a mirror, and
where the spatial modulator is a transmissive film resulting in one of a spatial pattern of polarization change, transmission loss, transmission phase shift, or a combination thereof.

6. The photonic waveform generator of claim 1, wherein an input and an output of the pulse shaper are co-linear.

7. A method for generating an electrical pulse with controlled spectral characteristics, the method comprising:
- receiving an optical signal;
- Fourier transforming the optical signal using a pulse shaper to generate a transformed optical signal;
- pre-distorting the transformed optical signal to generate a pre-distorted transformed optical signal; and
- stretching the pre-distorted transformed optical signal through a dispersive pulse stretcher; and
- converting the stretched pre-distorted transformed optical signal to an electrical signal by an optical-to-electrical converter,
- wherein the pre-distortion of the transformed optical signal removes distortion of the electrical signal that exists in the absence of the pre-distortion caused by violation of far field limitation between the optical signal and the electrical signal,
- where the pre-distorted transformed optical signal has amplitude and optical phase spectral shaping given by $A_{in}(\omega)$,
- where $A_{in}(\omega)$ is based on a Fourier transform of the time domain representation $a_{in}(t)$ of the pre-distorted transformed optical signal,
- where $$a_{in}(t) = a_{FTM}(t)\exp\left(j\frac{t^2}{2\psi_2}\right),$$

where $a_{FTM}(t)$ is calculated so that the $|A_{FTM}(\omega=-t/\psi_2)|^2$ is equal to the desired electrical signal waveform, where $A_{FTM}(\omega)$ is the Fourier transform of $a_{FTM}(t)$, and $$\psi_2 = -\frac{\partial^2 \beta(\omega)}{\partial \omega^2}L,$$

where $\omega_2$ is a group delay dispersion of the dispersive pulse stretcher and $\beta(\omega)$ is a propagation constant in a medium in which the optical signal travels, the medium having length L.

8. The method of claim 7, wherein the optical-to-electrical converter is a photodetector.

9. The method of claim 8, wherein the photodetector is a photodiode.

10. The method of claim 7, photonic waveform generator of claim 1, wherein the dispersive pulse stretcher comprises an optical element having a non-zero dispersion characteristic.

11. The method of claim 7, wherein the pulse shaper comprises:
- a spatial modulator;
- an optical grating; and
- a reflective surface,
- wherein the spatial modulator is a liquid crystal module, disposed between the optical grating and the reflective surface,
- wherein the reflective surface is a mirror, and
- where the spatial modulator is a transmissive film resulting in one of a spatial pattern of polarization change, transmission loss, transmission phase shift, or a combination thereof.

12. The method of claim 7, wherein an input and an output of the pulse shaper are co-linear.

* * * * *